United States Patent
Chen et al.

(10) Patent No.: US 11,363,181 B2
(45) Date of Patent: Jun. 14, 2022

(54) DISPLAY MODULE AND DISPLAY DEVICE

(71) Applicant: Wuhan China Star Optoelectronics Semiconductor Display Technology Co., Ltd., Wuhan (CN)

(72) Inventors: Jun Chen, Wuhan (CN); Liang Sun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 246 days.

(21) Appl. No.: 16/954,528

(22) PCT Filed: Mar. 17, 2020

(86) PCT No.: PCT/CN2020/079764
§ 371 (c)(1),
(2) Date: Jun. 17, 2020

(87) PCT Pub. No.: WO2021/164084
PCT Pub. Date: Aug. 26, 2021

(65) Prior Publication Data
US 2022/0116518 A1   Apr. 14, 2022

(30) Foreign Application Priority Data
Feb. 19, 2020   (CN) .......................... 202010101974.4

(51) Int. Cl.
*H04N 5/225* (2006.01)
*H05K 5/03* (2006.01)

(52) U.S. Cl.
CPC ............. *H04N 5/2257* (2013.01); *H05K 5/03* (2013.01)

(58) Field of Classification Search
CPC .............................. H04N 5/2257; H05K 5/03
See application file for complete search history.

(56) References Cited

U.S. PATENT DOCUMENTS

| | | | |
|---|---|---|---|
| 10,602,631 B2* | 3/2020 | Song | B32B 7/12 |
| 2014/0368757 A1* | 12/2014 | Chen | G06F 3/0443 349/12 |
| 2016/0104850 A1* | 4/2016 | Joo | H01L 27/3234 428/116 |
| 2018/0125343 A1 | 5/2018 | Schostek et al. | |
| 2019/0138127 A1* | 5/2019 | Seo | H05K 5/03 |
| 2019/0158713 A1* | 5/2019 | Mcmillan | H01L 27/3234 |

(Continued)

FOREIGN PATENT DOCUMENTS

| CN | 109068044 | 12/2018 |
|---|---|---|
| CN | 109147595 | 1/2019 |

(Continued)

*Primary Examiner* — Amy R Hsu

(57) ABSTRACT

The present application provides a display module and a display device, wherein a display panel is provided with an opening; a cover plate covers the display panel and has a first refractive index; a camera module is disposed corresponding to the opening; a light-transmitting body is disposed in the opening and has a second refractive index; and a spacer layer is disposed between the external camera module and the light-transmitting body and has a third refractive index, wherein the second refractive index is greater than or equal to the first refractive index, and the second refractive index is greater than the third refractive index.

15 Claims, 1 Drawing Sheet

(56) References Cited

U.S. PATENT DOCUMENTS

2020/0357871 A1* 11/2020 Chung ................ H01L 27/3227
2021/0151425 A1* 5/2021 Kim ...................... H01L 27/326

FOREIGN PATENT DOCUMENTS

| CN | 109164648 | 1/2019 |
| CN | 109218475 | 1/2019 |
| CN | 110062082 | 7/2019 |
| CN | 110753470 | 2/2020 |
| JP | 2018-134380 | 8/2018 |
| WO | WO 2019/240331 | 12/2019 |

* cited by examiner

DISPLAY MODULE AND DISPLAY DEVICE

RELATED APPLICATIONS

This application is a National Phase of PCT Patent Application No. PCT/CN2020/079764 having International filing date of Mar. 17, 2020, which claims the benefit of priority of Chinese Patent Application No. 202010101974.4 filed on Feb. 19, 2020. The contents of the above applications are all incorporated by reference as if fully set forth herein in their entirety.

FIELD AND BACKGROUND OF THE INVENTION

The present application relates to a field of display technology, and in particular, to a display module and a display device.

With continuous development of display technology and public demand, in recent years in the mobile electronic device market, it can be seen that a high scree-to-body ratio is an irresistible trend. However, because there are some necessary components on a front panel of the mobile electronic device, such as a camera, infrared sensor, iris camera, etc., it is necessary to provide an opening on the screen.

However, due to the limitation of the camera module's field angle, display frame, display thickness, etc., a diameter of the opening on the existing screen is relatively large, which reduces the scree-to-body ratio.

SUMMARY OF THE INVENTION

Embodiments of the present application provide a display module and a display device, so as to solve the technical problem of limitation of the camera module's field angle, display frame, display thickness, etc. of the existing display module, which causes the screen corresponding to the camera module to be opened with an opening having a larger diameter, thereby reducing the scree-to-body ratio.

An embodiment of the present application provides a display module including:

a display panel provided with an opening configured to correspondingly dispose an external camera module;

a cover plate covering the display panel and one end of the opening, the cover plate having a first refractive index;

a light-transmitting body disposed in the opening, the light-transmitting body having a second refractive index; and a spacer layer disposed between the external camera module and the light-transmitting body, the spacer layer having a third refractive index;

wherein the light-transmitting body includes a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index; and wherein the third refractive index is smaller than the first refractive index, wherein the spacer layer is an air layer.

In the display module according to an embodiment of the present application, the display module includes a first light-shielding layer disposed on a side of the cover plate facing the display panel, and the first light-shielding layer forms a closed structure along a periphery of the opening.

In the display module according to an embodiment of the present application, the display module includes an optical adhesive layer and a second light-shielding layer, wherein the optical adhesive layer is disposed between the cover plate and the display panel and covers the cover plate and the first light-shielding layer; and the second light-shielding layer is disposed on a peripheral side of the light-transmitting body, wherein one end of the second light-shielding layer is connected to the first light-shielding layer, and another end of the second light-shielding layer covers at least the optical adhesive layer.

In the display module according to an embodiment of the present application, the light-transmitting body is made of one of plastic, glass, and optical light-transmitting glue.

An embodiment of the present application further provides a display module, which includes:

a display panel provided with an opening configured to correspondingly dispose an external camera module;

a cover plate covering the display panel and one end of the opening, the cover plate having a first refractive index;

a light-transmitting body disposed in the opening, the light-transmitting body having a second refractive index; and a spacer layer disposed between the external camera module and the light-transmitting body, the spacer layer having a third refractive index;

wherein the light-transmitting body includes a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index.

In the display module according to an embodiment of the present application, the third refractive index is smaller than the first refractive index.

In the display module according to an embodiment of the present application, the spacer layer is an air layer.

In the display module according to an embodiment of the present application, the display module includes a first light-shielding layer disposed on a side of the cover plate facing the display panel, and the first light-shielding layer forms a closed structure along a periphery of the opening.

In the display module according to an embodiment of the present application, the display module includes an optical adhesive layer and a second light-shielding layer, wherein the optical adhesive layer is disposed between the cover plate and the display panel and covers the cover plate and the first light-shielding layer; and the second light-shielding layer is disposed on a peripheral side of the light-transmitting body, wherein one end of the second light-shielding layer is connected to the first light-shielding layer, and another end of the second light-shielding layer covers at least the optical adhesive layer.

In the display module according to an embodiment of the present application, the light-transmitting body is made of one of plastic, glass, and optical light-transmitting glue.

The present application also relates to a display device, including:

a display panel provided with an opening configured to correspondingly dispose an external camera module;

a cover plate covering the display panel and one end of the opening, the cover plate having a first refractive index;

a light-transmitting body disposed in the opening, the light-transmitting body having a second refractive index; and a spacer layer disposed between the external camera module and the light-transmitting body, the spacer layer having a third refractive index;

wherein the light-transmitting body includes a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index.

In the display device according to an embodiment of the present application, the third refractive index is smaller than the first refractive index.

In the display device according to an embodiment of the present application, the spacer layer is an air layer.

In the display device according to an embodiment of the present application, the display device includes a first light-shielding layer, an optical adhesive layer, and a second light-shielding layer;

wherein the display module includes a first light-shielding layer disposed on a side of the cover plate facing the display panel, and the first light-shielding layer forms a closed structure along a periphery of the opening;

wherein the display module includes an optical adhesive layer and a second light-shielding layer, wherein the optical adhesive layer is disposed between the cover plate and the display panel and covers the cover plate and the first light-shielding layer; and the second light-shielding layer is disposed on a peripheral side of the light-transmitting body, wherein one end of the second light-shielding layer is connected to the first light-shielding layer, and another end of the second light-shielding layer covers at least the optical adhesive layer.

In the display device according to an embodiment of the present application, the light-transmitting body is made of one of plastic, glass, and optical light-transmitting glue.

The display device of the present application changes the light path through the arrangement of the light-transmitting body of high refractive-index and the spacer layer of low refractive-index, that is, light is refracted for the first time when passing through an interface between the light-transmitting body and the spacer layer, and refracted for the second time when passing through an interface between the light-transmitting body and the cover plate, so that an radius of a projection area of a divergence angle of the camera module at the interface between the light-transmitting body and the cover plate is reduced when a field angle of the camera is kept constant, thereby achieving the effects of reducing the diameter of the opening and increasing the scree-to-body ratio.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Figure 2:
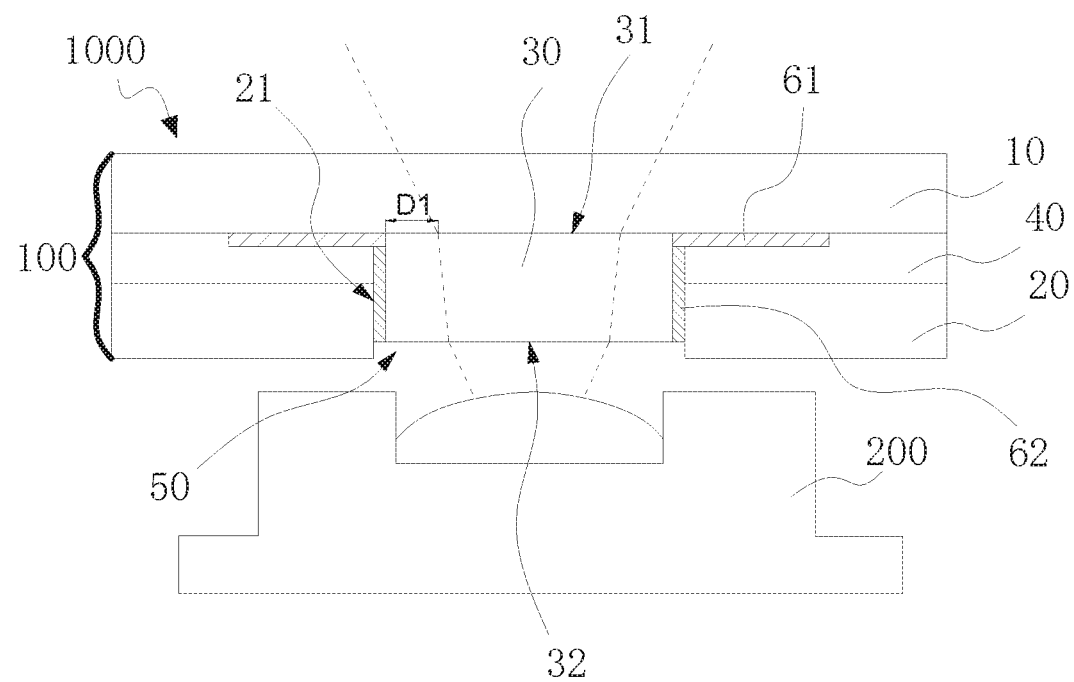
FIG. 2 is a schematic structural diagram of a display device according to an embodiment of the present application.

Referring to FIG. 2, FIG. 2 is a schematic structural diagram of a display device according to an embodiment of the present application. The display device according to the embodiment of the present application includes a display module 100 and a camera module 200. The display module 100 includes a cover plate 10, a display panel 20, a light-transmitting body 30, an optical adhesive layer 40, a spacer layer 50, and a first light-shielding layer 61 and second light-shielding layer 62.

The display panel 20 is provided with an opening 21. The cover plate 10 covers the display panel 20, and one end of the opening 21. The light-transmitting body 30 is disposed in the opening 21. The optical adhesive layer 40 is disposed between the display panel 20 and the cover plate 10. The camera module 200 is disposed on a side of the display panel 20 away from the cover plate 10 corresponding to the opening 21. The spacer layer 50 is disposed between the camera module 200 and the light-transmitting body 30. The first light-shielding layer 61 is disposed on a surface of the cover plate 10 facing the optical adhesive layer 40, and is located on a peripheral side of the opening 21. The second light-shielding layer 62 is disposed on a peripheral side of the light-transmitting body 30 and is connected to the first light-shielding layer 61.

The light-transmitting body 30 includes a first end surface 31 and a second end surface 32 which are opposite to each other. The first end surface 31 overlaps the cover plate 10. The second end surface 32 overlaps the spacer layer 50. Optionally, the translucent body 30 is made of one of plastic, glass, and optical translucent glue.

The cover plate 10 has a first refractive index. The light-transmitting body 30 has a second refractive index. The spacer layer 50 has a third refractive index. The second refractive index is greater than or equal to the first refractive index. The second refractive index is greater than the third refractive index.

In the display device 1000 of this embodiment, since the second refractive index is greater than the first refractive index, the light incident from the outside is refracted at an overlapping interface between the light-transmitting body 30 and the cover plate 10, so that the incident angle of the light in the light-transmitting body 30. becomes smaller; then, since the second refractive index is greater than the third refractive index, the incident light is refracted again at an overlapping interface of the light-transmitting body 30 and the spacer layer 50 to increase the incident angle; and finally the light is radiated to the camera module 200.

Figure 1:
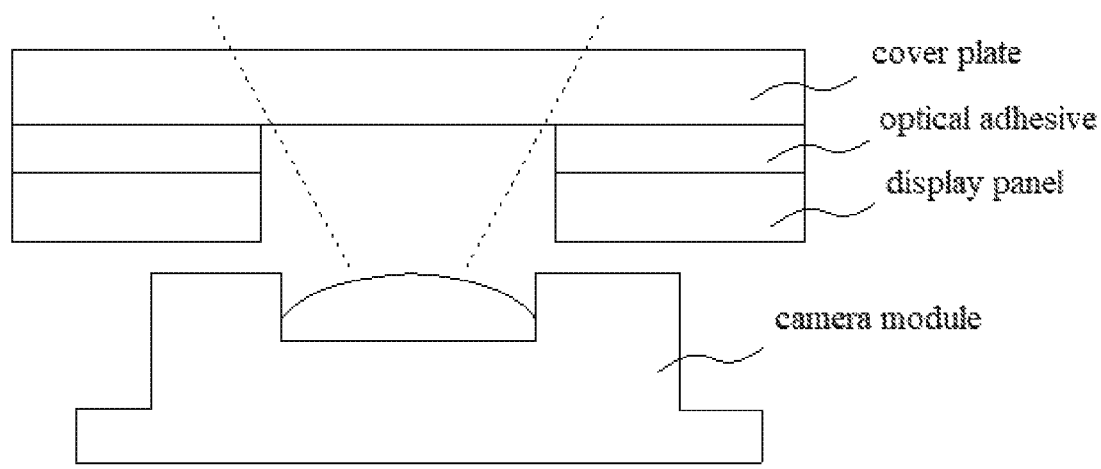
FIG. 1 is a schematic structural diagram of a display device in the prior art.

Compared with the prior art in which only air is present in the opening (referring to FIG. 1), the display device 1000 of this embodiment changes the light path through the arrangement of the light-transmitting body 30 and the spacer layer 50, and makes the light path entering the opening change (refraction occurs twice) according to the law of refraction. An radius of a projection area of a divergence angle of the camera module 200 at the interface between the light-transmitting body 30 and the cover plate 10 will be reduced by a certain length D1 when a field angle of the camera is kept constant, so that the opening size required for the camera module 200 can be reduced, thereby increasing the scree-to-body ratio.

In the display device 1000 of this embodiment, the third refractive index is smaller than the first refractive index.

With this arrangement, the radius of the projection area of the divergence angle of the camera module 200 at the overlapping interface between the light-transmitting body 30 and the cover plate 10 is further reduced.

The spacer layer 50 is light-transmissive. Optionally, the spacer layer 50 is an air layer. When the spacer layer 50 is an air layer, material is saved. And because the refractive index of the air layer is low, it is beneficial to reduce the size of the opening 21. In some embodiments, the spacer layer may also be made of a light-transmitting material such as resin or optical adhesive.

In the display device 100 of this embodiment, the first light-shielding layer 61 is disposed on a side of the cover plate 10 facing the display panel 20. The first light-shielding layer 61 forms a closed structure along a periphery of the opening 21.

The optical adhesive layer 40 is disposed between the cover plate 10 and the display panel 20 and covers the cover plate 10 and the first light-shielding layer 61.

The second light-shielding layer 62 is provided on the peripheral side of the light-transmitting body 30. One end of the second light-shielding layer 62 is connected to the first light-shielding layer 61, and another end of the second light-shielding layer 62 covers at least the optical adhesive layer 40.

The introduction of the first light-shielding layer 61 can prevent the metal traces at the periphery of the opening 21 from being seen by a user, beneficial to aesthetics. The introduction of the second light-shielding layer 62 can prevent stray light emitted by the display panel 20 or external stray light from generating total reflection in the optical adhesive layer 40 and entering the light transmitting body 30, that is, entering a field angle of the camera module 200, which is beneficial to improve imaging quality of the camera module 200.

The present application also relates to a display module, wherein a display panel is provided with an opening configured to correspondingly dispose an external camera module;

a cover plate covers the display panel and one end of the opening, and the cover plate has a first refractive index;

a light-transmitting body is disposed in the opening, and the light-transmitting body has a second refractive index; and a spacer layer is disposed between the external camera module and the light-transmitting body, and the spacer layer has a third refractive index;

wherein the light-transmitting body includes a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index.

In the display module according to an embodiment of the present application, the display module includes a first light-shielding layer disposed on a side of the cover plate facing the display panel, and the first light-shielding layer forms a closed structure along a periphery of the opening.

In the display module according to an embodiment of the present application, the display module includes an optical adhesive layer and a second light-shielding layer, wherein the optical adhesive layer is disposed between the cover plate and the display panel and covers the cover plate and the first light-shielding layer; and the second light-shielding layer is disposed on a peripheral side of the light-transmitting body, wherein one end of the second light-shielding layer is connected to the first light-shielding layer, and another end of the second light-shielding layer covers at least the optical adhesive layer.

In the display module according to an embodiment of the present application, the light-transmitting body is made of one of plastic, glass, and optical light-transmitting glue.

A structure of the display module according to this embodiment of the present application includes the structure of the display module 100 of the display device 1000 according to the above embodiments, which is not repeated herein for brevity.

The display device of the present application changes the light path through the arrangement of the light-transmitting body of high refractive-index and the spacer layer of low refractive-index, that is, light is refracted for the first time when passing through an interface between the light-transmitting body and the spacer layer, and refracted for the second time when passing through an interface between the light-transmitting body and the cover plate, so that an radius of a projection area of a divergence angle of the camera module at the interface between the light-transmitting body and the cover plate is reduced when a field angle of the camera is kept constant, thereby achieving the effect of reducing the diameter of the opening and increasing the scree-to-body ratio.

As described above, for a person of ordinary skill in the art, various other corresponding changes and modifications can be made according to the technical solutions and technical concepts of this application, and all these changes and modifications should fall within the protection scope of the claims attached to this application.

What is claimed is:

1. A display module, comprising:
   a display panel provided with an opening configured to correspondingly dispose an external camera module;
   a cover plate covering the display panel and one end of the opening, the cover plate having a first refractive index;
   a light-transmitting body disposed in the opening, the light-transmitting body having a second refractive index; and
   a spacer layer disposed between the external camera module and the light-transmitting body, the spacer layer having a third refractive index;
   wherein the light-transmitting body comprises a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index; and
   wherein the third refractive index is smaller than the first refractive index, wherein the spacer layer is an air layer.

2. The display module according to claim 1, wherein the display module comprises a first light-shielding layer disposed on a side of the cover plate facing the display panel, and the first light-shielding layer forms a closed structure along a periphery of the opening.

3. The display module according to claim 2, wherein the display module comprises an optical adhesive layer and a second light-shielding layer, wherein the optical adhesive layer is disposed between the cover plate and the display panel and covers the cover plate and the first light-shielding layer; and
   the second light-shielding layer is disposed on a peripheral side of the light-transmitting body, wherein one end of the second light-shielding layer is connected to the first light-shielding layer, and another end of the second light-shielding layer covers at least the optical adhesive layer.

4. The display module according to claim 1, wherein the light-transmitting body is made of one of plastic, glass, and optical light-transmitting glue.

5. A display module, comprising:
a display panel provided with an opening configured to correspondingly dispose an external camera module;
a cover plate covering the display panel and one end of the opening, the cover plate having a first refractive index;
a light-transmitting body disposed in the opening, the light-transmitting body having a second refractive index; and
a spacer layer disposed between the external camera module and the light-transmitting body, the spacer layer having a third refractive index;
wherein the light-transmitting body comprises a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index.

6. The display module according to claim 5, wherein the third refractive index is smaller than the first refractive index.

7. The display module according to claim 5, wherein the spacer layer is an air layer.

8. The display module according to claim 5, wherein the display module comprises a first light-shielding layer disposed on a side of the cover plate facing the display panel, and the first light-shielding layer forms a closed structure along a periphery of the opening.

9. The display module according to claim 8, wherein the display module comprises an optical adhesive layer and a second light-shielding layer, wherein the optical adhesive layer is disposed between the cover plate and the display panel and covers the cover plate and the first light-shielding layer; and
the second light-shielding layer is disposed on a peripheral side of the light-transmitting body, wherein one end of the second light-shielding layer is connected to the first light-shielding layer, and another end of the second light-shielding layer covers at least the optical adhesive layer.

10. The display module according to claim 5, wherein the light-transmitting body is made of one of plastic, glass, and optical light-transmitting glue.

11. A display device comprising:
a display panel provided with an opening configured to correspondingly dispose an external camera module;
a cover plate covering the display panel and one end of the opening, the cover plate having a first refractive index;
a light-transmitting body disposed in the opening, the light-transmitting body having a second refractive index; and
a spacer layer disposed between the external camera module and the light-transmitting body, the spacer layer having a third refractive index;
wherein the light-transmitting body comprises a first end surface and a second end surface opposite to each other, the first end surface overlaps the cover plate, and the second end surface overlaps the spacer layer, wherein the second refractive index is greater than or equal to the first refractive index, and the second refractive index is greater than the third refractive index.

12. The display device according to claim 11, wherein the third refractive index is smaller than the first refractive index.

13. The display device according to claim 11, wherein the spacer layer is an air layer.

14. The display device according to claim 11, wherein the display device comprises a first light-shielding layer, an optical adhesive layer, and a second light-shielding layer;
wherein the display module comprises a first light-shielding layer disposed on a side of the cover plate facing the display panel, and the first light-shielding layer forms a closed structure along a periphery of the opening;
wherein the display module comprises an optical adhesive layer and a second light-shielding layer, wherein the optical adhesive layer is disposed between the cover plate and the display panel and covers the cover plate and the first light-shielding layer; and
the second light-shielding layer is disposed on a peripheral side of the light-transmitting body, wherein one end of the second light-shielding layer is connected to the first light-shielding layer, and another end of the second light-shielding layer covers at least the optical adhesive layer.

15. The display module according to claim 11, wherein the light-transmitting body is made of one of plastic, glass, and optical light-transmitting glue.

* * * * *